United States Patent
Fujisawa

(10) Patent No.: US 9,406,606 B2
(45) Date of Patent: Aug. 2, 2016

(54) SEMICONDUCTOR DEVICE HAVING A REDUCED AREA AND ENHANCED YIELD

(71) Applicant: Micron Technology, Inc., Boise, ID (US)

(72) Inventor: Hiroki Fujisawa, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/336,984

(22) Filed: Jul. 21, 2014

(65) Prior Publication Data

US 2015/0029776 A1   Jan. 29, 2015

(30) Foreign Application Priority Data

Jul. 26, 2013   (JP) ................. 2013-155264

(51) Int. Cl.
| | |
|---|---|
| *G11C 17/00* | (2006.01) |
| *H01L 23/525* | (2006.01) |
| *G11C 29/00* | (2006.01) |
| G11C 17/16 | (2006.01) |
| H01L 23/528 | (2006.01) |

(52) U.S. Cl.
CPC .......... *H01L 23/5252* (2013.01); *G11C 29/789* (2013.01); G11C 17/16 (2013.01); H01L 23/5286 (2013.01); H01L 2924/0002 (2013.01)

(58) Field of Classification Search
CPC ... H01L 23/5252; G11C 29/789; G11C 17/16
USPC ............................................. 365/96, 63, 226
See application file for complete search history.

(56) References Cited

U.S. PATENT DOCUMENTS

| | | | | |
|---|---|---|---|---|
| 5,166,556 A * | 11/1992 | Hsu | ................ | H01L 23/5252 257/50 |
| 5,495,436 A * | 2/1996 | Callahan | ................ | G11C 17/18 327/536 |
| 5,734,617 A * | 3/1998 | Zheng | ................ | G11C 7/067 365/100 |
| 5,812,477 A * | 9/1998 | Casper | ................ | G11C 17/18 327/526 |
| 5,831,923 A * | 11/1998 | Casper | ................ | G11C 17/18 365/225.7 |
| 5,952,845 A * | 9/1999 | Merritt | ................ | G11C 17/18 326/38 |
| 6,115,283 A * | 9/2000 | Hidaka | ................ | G11C 17/18 365/149 |
| 6,617,914 B1 * | 9/2003 | Kothandaraman | ..... | G11C 17/18 257/530 |
| 6,686,791 B2 * | 2/2004 | Zheng | ................ | H01L 23/5252 257/E23.147 |
| 6,759,895 B2 * | 7/2004 | Takami | ................ | G11C 29/848 326/37 |
| 7,280,397 B2 * | 10/2007 | Scheuerlein | ....... | G11C 14/0063 365/154 |
| 7,307,880 B2 * | 12/2007 | Ko | ................ | G11C 17/18 365/185.04 |
| 7,349,281 B2 * | 3/2008 | Kouchi | ................ | G11C 17/16 365/189.011 |
| 7,567,114 B2 * | 7/2009 | Matsubara | ............. | G11C 17/18 327/525 |
| 7,915,916 B2 * | 3/2011 | Wilcox | ............ | H03K 19/17748 326/37 |
| 8,339,830 B2 * | 12/2012 | Yamauchi | .......... | G11C 11/5692 365/200 |
| 8,344,445 B2 * | 1/2013 | Lu | ................ | G11C 17/16 257/314 |
| 8,638,589 B2 * | 1/2014 | Lu | ................ | G11C 16/10 257/317 |
| 8,804,448 B2 * | 8/2014 | Park | ................ | G11C 8/10 365/189.16 |
| 8,842,482 B1 * | 9/2014 | Kunst | ................ | G11C 7/04 365/185.04 |
| 9,013,910 B2 * | 4/2015 | Chen | ................ | G11C 17/18 257/317 |
| 9,087,588 B2 * | 7/2015 | Kwon | ................ | G11C 17/06 |
| 9,165,679 B2 * | 10/2015 | Oh | ................ | G11C 29/785 |
| 2007/0091662 A1 | 4/2007 | Matsubara | | |

* cited by examiner

*Primary Examiner* — Viet Q Nguyen
(74) *Attorney, Agent, or Firm* — Dorsey & Whitney LLP

(57) ABSTRACT

A device includes a first power supply line supplying a first voltage, first, second, and third nodes, a selection circuit connected between the first power supply line and the first node, a first anti-fuse connected between the first node and the second node, and a second anti-fuse connected between the first node and the third node. The second node and the third node are not connected to each other.

14 Claims, 9 Drawing Sheets

SEMICONDUCTOR DEVICE HAVING A REDUCED AREA AND ENHANCED YIELD

This application is based upon and claims the benefit of priority from Japanese patent application No. 2013-155264, filed on Jul. 26, 2013, the disclosure of which is incorporated herein in its entirety by reference.

BACKGROUND OF THE INVENTION

1. Field of the Invention

The present invention relates to a semiconductor device and, more particularly, to a semiconductor device for storing information with use of a change of a state of an electric fuse (an anti-fuse), which will also be abbreviated as "AF", employing a breakdown of an oxide film.

2. Description of Related Art

The storage capacity of a memory semiconductor memory device as represented by a DRAM (Dynamic Random Access Memory) increases year and year along the progress of micro-fabrication techniques. The number of defective parts included per one chip also increases as miniaturization is proceeded.

Semiconductor memory devices are therefore provide with both normal memory cells, which are memory cells for normal use, and redundant memory cells, which substitute when a defect occurs in a normal memory cell. The defect remedy technology for replacing normal memory cells in which defects has been detected (hereinunder referred to as "defective memory cells") with redundant memory cells to improve product yield has become a crucial technology.

In this connection, the defective memory cells are also called "defect memory cells". Inasmuch as each memory cell corresponds to a bit, the defective memory cells are also called "detective bits".

In order to replace a defective memory cell with a redundant memory cell, the address of the defective memory cell (hereinunder referred to as "fail address") must be stored. The fail address is also called a "defective address".

Laser fuses and the electric fuses (anti-fuses) (AFs) are used as nonvolatile memory elements for storing fail addresses. The laser fuse comprises a fuse in which a conductor is fused and insulated by a laser. The anti-fuse comprises a fuse in which a high voltage is applied to an insulator such as an oxide film to break down the insulator to cause conduction.

The fuses used as such as a method of repairing the defective memory cells of the DRAM has been moved to the anti-fuses from the laser fuses. This is because there are large merits for example no need of an opening process for the laser fuses, reliability improvement of moisture resistance or the like, no need of a process management of a remaining thickness on the laser fuses, passableness of metal wires on the fuses, and so on.

In the manner well known in the art, the AF is a method of storing the fail addresses of the detective bits by applying (carrying out connection operation) the high voltage to a gate oxide film or a memory cell film to control conducting/non-conducting thereof. This information is held after a power supply voltage is shut down.

Inasmuch as connection of the AF is an operation which actively breaks down the gate oxide film, it is an approach which is opposite to a concept of the reliability (high breakdown voltage) of the gate oxide film, and it is therefore difficult to control a breakdown.

JP-A-2007-116045 (which corresponds to US 2007/0091662 A1 and which will later be called "Patent Literature 1") proposes several methods related to electric fuses (anti-fuses) mounted on a semiconductor device.

The following analysis is obtained in terms of this invention based on experience of the present inventor.

FIG. 4 of Patent Literature 1 (FIG. 6 of US 2007/0091662 A1) discloses an "OR cell scheme" for storing one bit by two AF cells (which will later be called a "Conventional Example 3"). However, an increase of an area becomes issue in the OR cell scheme.

FIG. 7 of Patent Literature 1 (FIG. 2 of US 2007/0091662 A1) discloses an "OR withdrawn scheme" for storing one bit by one AF cell (which will later be called a "Conventional Example 2"). The OR withdrawn scheme is effective to downsizing of an area so as to reduce the area by about fifty-three percent as compared with the above-mentioned OR cell scheme, and it is therefore possible to resolve the problem of the above-mentioned OR cell scheme. However, the OR withdrawn scheme has a bad feature of dropout or failure bits of the AF cell after connection, and the problem arises because it is difficult to improve connection yield. It is necessary for the OR withdrawn scheme to prolong the connection time interval up to 20 milliseconds or more.

FIG. 1 of Patent Literature 1 (FIG. 3 of US 2007/0091662 A1) discloses a "twin cell scheme" which is a scheme for storing one bit by two AF cells connected in parallel (which will later be called a "Conventional Example 1"). The twin cell scheme reduces the area by about forty-nine percent as compared with the above-mentioned OR cell scheme and it is therefore possible to resolve the problem of the above-mentioned OR cell scheme (the increase of the area). In addition, the twin cell scheme has an increased area as compared with the above-mentioned OR withdrawn scheme.

At this point, it may be understood that the twin cell scheme is an optimum scheme among their three schemes as the middle means in which the problem of the above-mentioned OR cell scheme (the increase of the area) is suppressed to some extent and the problem of the above-mentioned OR withdrawn scheme (the connection yield) is resolved.

However, in the manner which will later be described with reference to drawings in detail, it is understood, as result of carrying out an experiment by the present inventor, that yield of the twin cell scheme are equal to the OR withdrawn scheme and it does not have the effect of the yield at all.

SUMMARY

According to a first aspect of the present invention, there is provided a device including: a first power supply line supplying a first voltage; first, second, and third nodes; a selection circuit connected between the first power supply line and the first node; a first anti-fuse connected between the first node and the second node; and a second anti-fuse connected between the first node and the third node, the second and third nodes being not connected to each other.

According to a second aspect of the present invention, there is provided a device including: first and second anti-fuses configured to store one bit information, and one ends of the first and second anti-fuses being connected to each other to be biased in a same voltage as each other when one of the first and second anti-fuses is programmed, and other ends of the first and second anti-fuses being free from being connected to each other to be biased in a different voltage from each other when the one of the first and second anti-fuses is programmed.

According to a third aspect of the present invention, there is provided a method including: performing a programming operation on first and second anti-fuses configured to store one bit information, the performing comprising: performing a first connection by applying a first voltage in common to one ends of the first and second anti-fuses, applying a second voltage to other end of the first anti-fuse, and applying a third voltage to other end of the second anti-fuse concurrently, the third voltage being lower than the first voltage and higher than the second voltage; and performing a second connection by applying the first voltage in common to the one ends of the first and second anti-fuses, applying the third voltage to the other end of the first anti-fuse, and applying the second voltage to the other end of the second anti-fuse concurrently.

DETAILED DESCRIPTION OF THE EMBODIMENTS

[Related Art]
Before describing of the present invention, the related art will be explained in detail with reference to FIGS. 1 to 3 in order to facilitate the understanding of the present invention.

Figure 1:
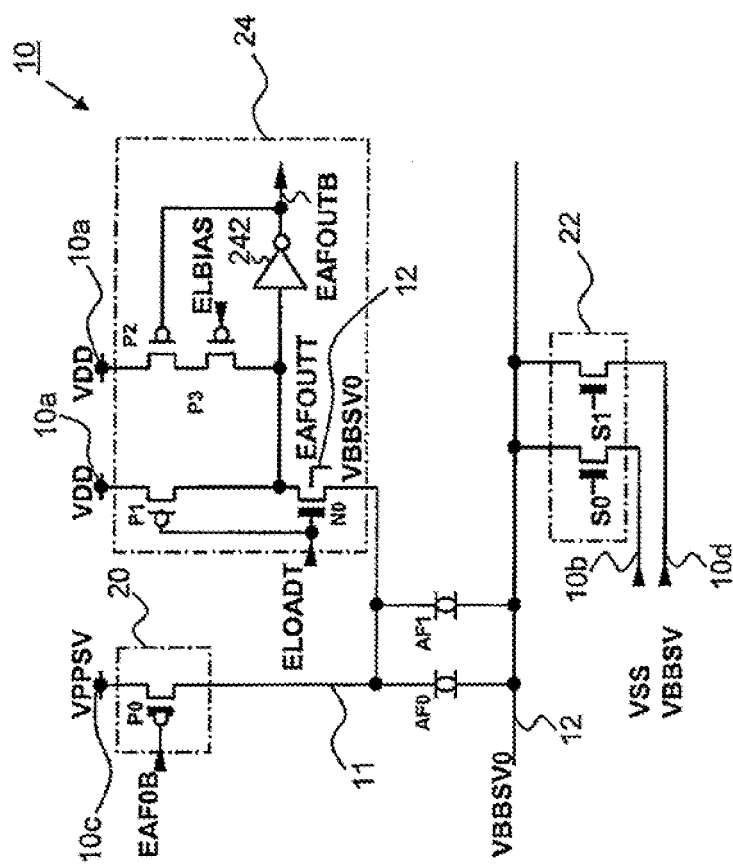
FIG. 1 is a circuit diagram showing a configuration of a related AF relief circuit for use in a semiconductor memory device.
Figure 3:
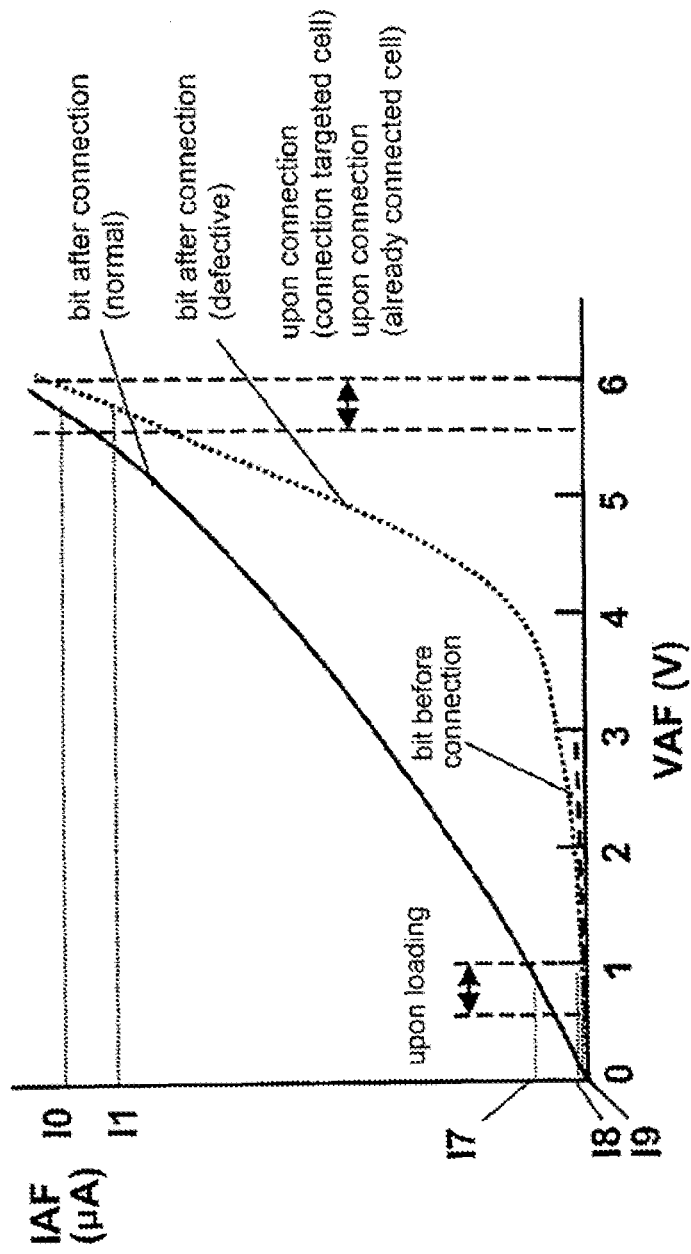
FIG. 3 is a view showing an I-V plot of an anti-fuse of the related AF relief circuit for use in describing problems of the related AF relief circuit illustrated in FIG. 1.

Incidentally, the described related art substantially corresponds to the conventional twin cell scheme "the Conventional Example 1" which is illustrated in FIG. 1 of the above-mentioned Patent Literature 1 (FIG. 3 of US 2007/0091662 A1).

FIG. 1 is a circuit diagram showing a configuration of a related AF relief circuit 10 for use in a semiconductor memory device.

As shown in FIG. 1, the related AF relief circuit 10 has power supply applied terminals 10a applied with a power supply voltage VDD, a ground applied terminal 10b applied with a ground voltage VSS, a high potential applied line 10c applied with an AF connection voltage High level VPPSV, and a low potential applied line 10d applied with an AF connection voltage Low level VBBSV. In addition, the related AF relief circuit 10 has, as nodes, a first node 11 and a second node 12. As apparent from FIG. 1, the second node 12 is supplied with a first potential VBBSV0.

The related AF relief circuit 10 comprises a selection circuit 20, a first anti-fuse AF0, a second anti-fuse AF1, a control circuit 22, and a readout circuit 24.

The selection circuit 20 is connected between the high potential applied line 10c and the first node 11. Each of the first anti-fuse AF0 and the second anti-fuse AF1 is connected between the first node 11 and the second node 12. The control circuit 22 is connected between the second node 12 and both of the ground applied terminal 10b and the low potential applied line 10d. The readout circuit 24 is connected to the first node 11.

More specifically, the selection circuit 20 comprises a first P-channel MOSFET (metal oxide semiconductor field effect transistor) P0. The first P-channel MOSFET P0 has a source connected to the high potential applied line 10c, a drain connected to the first node 11, a gate supplied with a connection condition AF cell selection signal EAF0B. In this connection, the AF connection voltage High level VPPSV is also called a first voltage while the high potential applied line 10c is also called a first power supply line.

As described above, the related AF relief circuit 10 comprises the first power supply line (10c) supplied with the first voltage (VPPSV), the first and the second nodes (11, 12), the selection circuit (20) connected between the first power supply line (10c) and the first node (11), the first anti-fuse (AF0) connected between the first node (11) and the second node (12), and the second anti-fuse (AF1) connected between the first node (11) and the second node (12).

The control circuit 22 comprises first and second MOS switches S0 and S1. The first MOS switch S0 is connected between the second node 12 and the ground applied terminal 10b. The second MOS switch S1 is connected between the second node 12 and the low potential applied line 10d.

The readout circuit 24 comprises second through fourth P-channel MOSFETs P1, P2, and P3, a first N-channel MOSFET N0, and an inverter circuit 242.

The second P-channel MOSFET P1 has a source connected to the power supply applied terminal 10a and a gate supplied with a loading condition AF cell selection signal ELOADT. The first N-channel MOSFET N0 has a source connected to the first node 11, a substrate connected the second node 12, and a gate supplied with the loading condition AF cell selection signal ELOADT. A drain of the second P-channel MOSFET P1 and a drain of the first N-channel MOSFET N0 are connected to each other at a connection point (an output node) which produces a loading condition AF cell output signal EAFOUTT. Accordingly, the second P-channel MOSFET P1 and the first N-channel MOSFET N0 constitute a C-MOS (Complementary metal oxide semiconductor) inverter.

The inverter circuit 242 is connected to the output node of the above-mentioned C-MOS inverter. The inverter circuit 242 inverts the loading condition AF cell output signal EAFOUTT to produce an inverted loading condition AF cell output signal EAFOUTB.

The third P-channel MOSFET P2 and the fourth P-channel MOSFET P3 are connected in series between the power supply applied terminal 10a and the output node of the C-MOS inverter. Specifically, the third P-channel MOSFET P2 has a source connected to the power supply applied terminal 10a, a drain connected to a source of the fourth P-channel MOSFET P3, a gate supplied with the inverted loading condition AF cell output signal EAFOUTB. The fourth P-channel MOSFET P3 has a drain connected to the output node of the C-MOS inverter and a gate supplied with a loading condition bias voltage ELBIAS.

Figure 2:
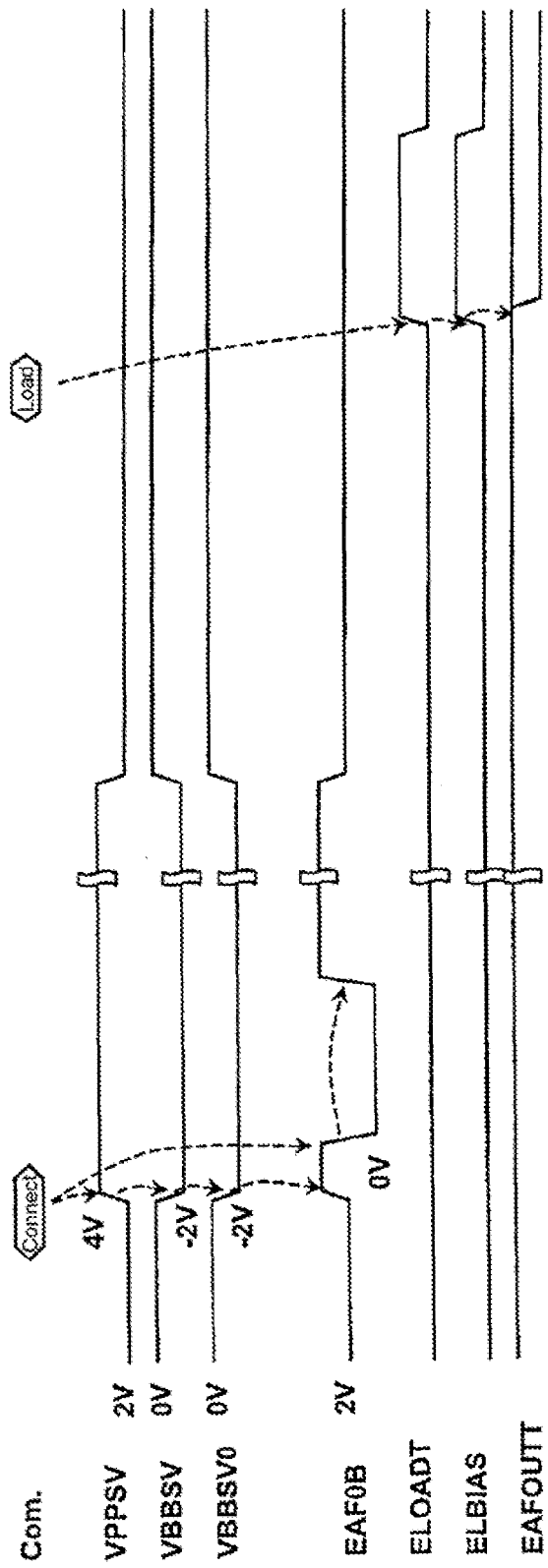
FIG. 2 is a waveform view showing an example of operation waveforms of the related AF relief circuit illustrated in FIG. 1.

Referring now to FIG. 2, description will be made as regards operation of the related AF relief circuit 10.

FIG. 2 shows operation waveforms of the related AF relief circuit 10 illustrated in FIG. 1

(1) First, the description will proceed to an initial state. In the initial state, the AF connection voltage High level VPPSV is set to 2 volts, the connection condition AF cell selection signal EAF0B is also set to 2 volts, the first MOS switch S0 in the control circuit 22 is turned on, the second MOS switch S1 therein is turned off. Hence, the second node 12 is applied with the ground voltage of 0 volts as the first potential VBBSV0. Inasmuch as the loading condition AF cell selection signal ELOADT is put into a Low level and the loading condition bias voltage ELBIAS is put into a Low level, the loading condition AF cell output signal EAFOUTT becomes a High level.

(2) Second, the description will proceed to a connection operation after the initial state. In the connection operation, the AF connection voltage High level VPPSV is risen to 4 volts, the connection condition AF cell selection signal EAF0B is also risen to 4 volts, the control circuit 22 turns the first MOS switch S0 off and turns the second MOS switch S1 on. Hence, the second node 12 is applied with the AF connection voltage Low level VBBSV of −2 volts as the first potential VBBSV0.

In the manner as described above, the connection operation is carried out by applying a high voltage between both terminals of the first and the second anti-fuses AF0 and AF1. In the related AF relief circuit 10, it is impossible to connect two anti-fuses AF0 and AF1. This reason is as follows. For example, it is assumed that the first anti-fuse AF0 is connected to be put into a conduction state. Under the circumstances, a large current flows in the first anti-fuse AF0 side, a voltage drop occurs, a voltage is not applied to the second anti-fuse AF1 side, and the connection operation does not occurs in the second anti-fuse AF1.

After the connection operation comes to an end, once the connection condition AF cell selection signal EAF0B is put into 0 volts, after a lapse of a predetermined time interval, the connection condition AF cell selection signal EAF0B is again risen to 4 volts. Thereafter, this operation is repeated.

(3) Third, the description will proceed to a loading operation after the connection operation.

In this connection, after the connection operation, the respective nodes on the circuit are biased to voltage values which are similar to those of the above-mentioned initial state. It will be assumed that the loading operation is carried out in this state.

In the loading operation, both of the loading condition AF cell selection signal ELAODT and the loading condition bias voltage ELBIAS change from the Low level to a High level. In this event, if either the first anti-fuse AF0 or the second anti-fuse AF1 is destroyed and connected, the loading condition AF cell output signal EAFOUTT changes from the High level to a Low level. On the other hand, if both of the first and the second anti-fuses AF0 and AF1 are not destroyed and not connected, the loading condition AF cell output signal EAFOUTT stays the High level.

Until now, it has been considered that yield is improved in the related AF relief circuit 10 because the fuse enable to easily destroy between the two anti-fuses AF0 and AF1 can be connected. However, the present inventor ensured by experiment that the yield of the related AF relief circuit 10 is a low yield having a level which is substantially equivalent to that of the above-mentioned OR withdrawn scheme (the Conventional Example 2).

Referring now to FIG. 3, description will be made as regards problems of the related AF relief circuit 10 illustrated in FIG. 1.

FIG. 3 is a view showing a typical I-V plot of three bits.

In FIG. 3, the abscissa represents a current IAF (IpA) flowing in the anti-fuse and the ordinate represents a voltage VAF (V) applied to the anti-fuse. In FIG. 3, a broken line represents an I-V plot of a bit before the connection of the anti-fuse, a solid line represents an I-V plot of a bit (a normal bit) after the connection of the anti-fuse, and a dotted line represents an I-V plot of a bit (a defective bit) after the connection of the anti-fuse.

Although a characteristic of the defective bit shown in the dotted line is not obvious hitherto, it is understood, by experiment result of the present invention, that the I-V plot of the anti-fuse of the defective bit is nonlinear. Although it is not understood what is this plot nonlinear for, it may be considered that this cause is ascribable to unevenness in process such as the gate oxide film and so on.

The cause dropping the yield is that the defective bits having the nonlinear shown in the dotted line of FIG. 3 occur in several bits when the anti-fuses of thousands of bits per one tip are connected.

Now, the description will proceed to this cause in further detail.

To begin with, the description will proceed to the loading operation of the related AF relief circuit 10. Upon loading, a voltage of about 0.5 to 1 volts is applied to the anti-fuse, and a fuse state is read out by a current difference thereof.

In the "bit before connection" depicted at the broken line, a current dose not almost flow in a condition of application of 1 volt (see, 19 in FIG. 3).

On the other hand, in the "bit after connection (normal)" depicted at the solid line, a current of about 17 in FIG. 3 flows in the condition of application of 1 volt, and it is therefore possible to read out the fuse state by a difference between 17 and 19.

In a case of the "bit after connection (defective)", a large current flows at a high voltage due to a nonlinear characteristic, but a current does not almost flow in the condition of application of 1 volt upon the loading (see, 18 in FIG. 3). It is therefore impossible to read out the fuse state by a difference between 18 and 19 and it results in faulty.

Next, the description will proceed to the connection operation of the related AF relief circuit 10. Upon connection, a voltage about 6 volts is normally applied to the both ends of the anti-fuse in the manner which is described before.

In the "bit after connection (normal)" depicted at the solid line, inasmuch as the anti-fuse has a linear I-V plot, a large current flows in the anti-fuse when the voltage of 6 volt is applied to the anti-fuse (see, 10 in FIG. 3).

On the other hand, in the "bit after connection (defective)" depicted at the dotted line, although the anti-fuse has a nonlinear I-V plot, a large current also flows in the anti-fuse when the voltage of 6 volts is applied to the anti-fuse (see, 11 in FIG. 3).

So to speak, the "bit after connection (defective)" means an anti-fuse AF which is put into the connection state (e.g. the large current flows at the application of 6 volts) and which cannot read out data (e.g. a sufficient current does not flows at the application of 1 volt upon reading out (loading)).

In a case of the related AF relief circuit 10 (the Conventional Example 1) illustrated in FIG. 1, when one anti-fuse (e.g. the first anti-fuse AF0) is put into the "bit after connection (normal)" or the "bit after connection (defective)", the large current flows in this anti-fuse (the first anti-fuse AF0), a voltage is not applied to another anti-fuse (e.g. the second anti-fuse AF1) in which the connection is not carried out.

Accordingly, at a time when the one anti-fuse (the first anti-fuse AF0) is connected in the nonlinear characteristic shown in the dotted line of FIG. 3, the connection of the other anti-fuse (the second anti-fuse AF1) is not carried out and therefore the other anti-fuse (the second anti-fuse AF1) becomes the detective bit. When one AF cell is put into a detective bit state, another AF cell cannot be connected. For this reason, there are a pair of the AF cell impossible to load (i.e. the AF cell put into the connection state but impossible to read out data as the connection state) and the AF cell which is not connected, and as a consequence of this, the pair becomes the detective bit.

Accordingly, it has been understood that the yield of the related AF relief circuit 10 (the Conventional Example 1) illustrated in FIG. 1 is a yield equivalent to that of the above-mentioned OR withdrawn scheme (the Conventional Example 2) and there is no effect of the yield at all.

In the manner which is apparent from the above-mentioned description, there are the following problems in the related AF relief circuit 10 (the conventional twin cell scheme) illustrated in FIG. 1 although it is effective in reduction of area.

A first problem is no effect in yield of connection. This is because at a time when one anti-fuse is connected at a detective bit having a nonlinear I-V plot, connection of another anti-fuse is not carried out, and therefore there is no merit in which two anti-fuses are mounted at all.

A second problem is that a connection time interval increases. When the connection time interval increases, the I-V plot of the detective bit having the above-mentioned nonlinear I-V plot is slightly improved, and there is a tendency to increase a coincidence percentage. However, there is no realistic solution of a problem because a test interval increases by the same amount when the connection time interval increases.

Preferred embodiments of the present invention will be explained below in detail with reference to the accompany drawings.

[First Exemplary Embodiment]

Figure 4:
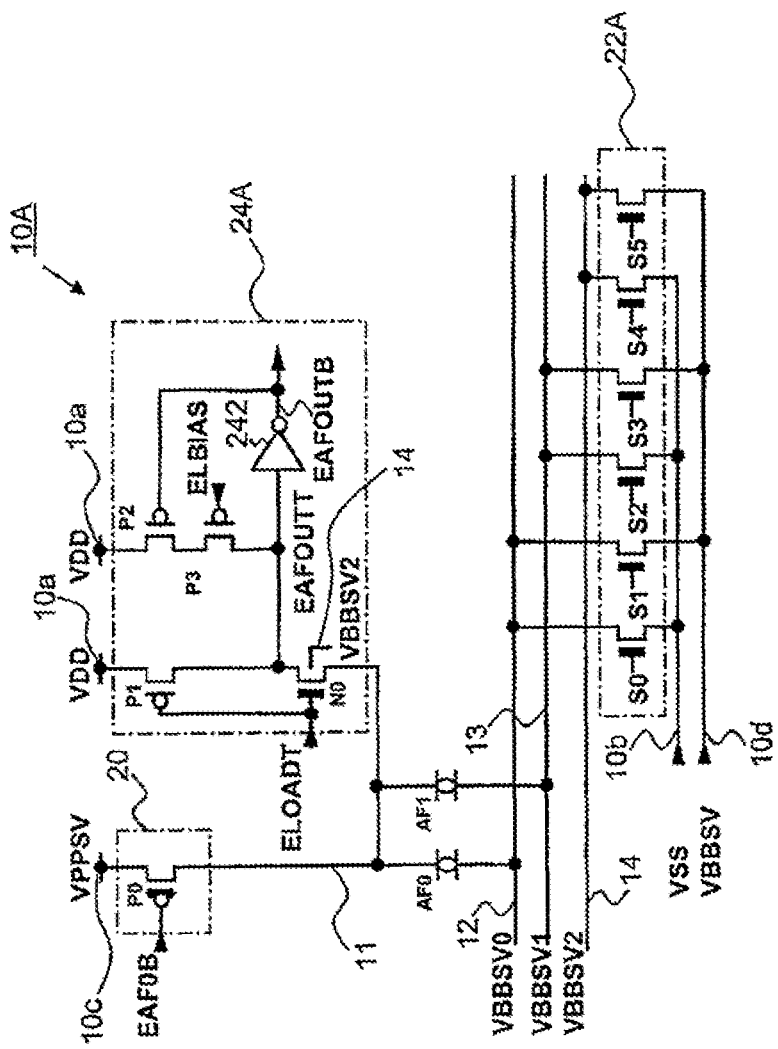
FIG. 4 is a circuit diagram showing a configuration of an AF relief circuit according to a first exemplary embodiment of the present invention, for use in a semiconductor memory device.

FIG. 4 is a circuit diagram showing a configuration of an AF relief circuit 10A according to a first exemplary embodiment of the present invention, for use in a semiconductor memory device.

The illustrated AF relief circuit 10A is similar in structure and operation to the related AF relief circuit 10 illustrated in FIG. 1 except that configurations of the nodes, the control circuit, and the readout circuit are modified from those illustrated in FIG. 1 as will later become clear and targets of connection of the first and the second anti-fuses AF0 and AF1 are different from those illustrated in FIG. 1. The control circuit and the readout circuit are therefore depicted at reference signs of 22A and 24A, respectively. Those having functions similar to the related AF relief circuit 10 illustrated in FIG. 1 are depicted at the same reference signs, the description thereof will be omitted for the sake of simplification of the description.

The illustrated AF relief circuit 10A has, as the nodes, first through fourth nodes 11, 12, 13, and 14. As apparent from FIG. 4, the second through the fourth nodes 12 to 14 are supplied with first through third potentials VBBSV0, VBBSV1, and VBBSV2, respectively.

The first anti-fuse AF0 is connected between the first node 11 and the second node 12 while the second anti-fuse AF1 is connected between the first node 11 and the third node 13. The second node 12 and the third node 13 are not connected to each other.

Accordingly, a semiconductor device according to the first exemplary embodiment comprises: the first power supply line (10c) supplying the first voltage (VPPSV); the first through the third nodes (11, 12, 13); the selection circuit (20) connected between the first power supply line (10c) and the first node (11); the first anti-fuse (AF0) connected between the first node (11) and the second node (12); and the second anti-fuse (AF1) connected between the first node (11) and the third node (13), and wherein the second node (12) and the third node (13) are not connected to each other.

The control circuit 22A comprises first through sixth MOS switches S0, S1, S2, S3, S4, and S5. The first MOS switch S0 is connected the second node 12 and the ground applied terminal 10b. The second MOS switch S1 is connected between the second node 12 and the low potential applied line 10d. The third MOS switch 82 is connected between the third node 13 and the ground applied terminal 10d. The fourth node S3 is connected between the third node 13 and the low potential applied line 10d. The fifth MOS switch S4 is connected between the fourth node 14 and the ground applied terminal 10b. The sixth MOS switch S5 is connected between the fourth node 13 and the low potential applied line 10d.

The readout circuit 24A is similar in structure and operation to the readout circuit 24 illustrated in FIG. 1 except that the substrate of the first N-channel MOSFET N0 is connected to the fourth node 14 supplied with the third potential VBBSV2.

In the manner as described above, the AF relief circuit 10A according to the first exemplary embodiment is characterized in that the two anti-fuses AF0 and AF1 are connected in parallel that is similar to the related AF relief circuit 10 and the AF connection voltage Low level VBBSV is separated that is different from the related AF relief circuit 10. And, in the AF relief circuit 10A according to the first exemplary embodiment, the selection circuit 20 and the readout circuit 24A are common to those of the related AF relief circuit 10. It is therefore, in the AF relief circuit 10A according to the first exemplary embodiment, possible to realize yield which is equivalent to that of the above-mentioned OR cell scheme (the Conventional Example 3) with increase of the area restrained at minimum, in the manner which will later be described.

In the AF relief circuit 10A according to the first exemplary embodiment, the connection operation is carried out for the first anti-fuse AF0 and the second anti-fuse AF1, independently, in the manner which will later be described. Therefore, the AF relief circuit 10A according to the first exemplary embodiment mounts therein a circuit for applying the second node 12 and the third node 13 with −2 volts and 0 volts as the first and the second potentials VBBSV0 and VBBSV1, respectively, so that a connection targeted anti-fuse is applied with 6 volts while a connection untargeted anti-fuse is applied with 4 volts.

(Operation of the AF Relief Circuit 10A According the First Exemplary Embodiment)

Figure 5:
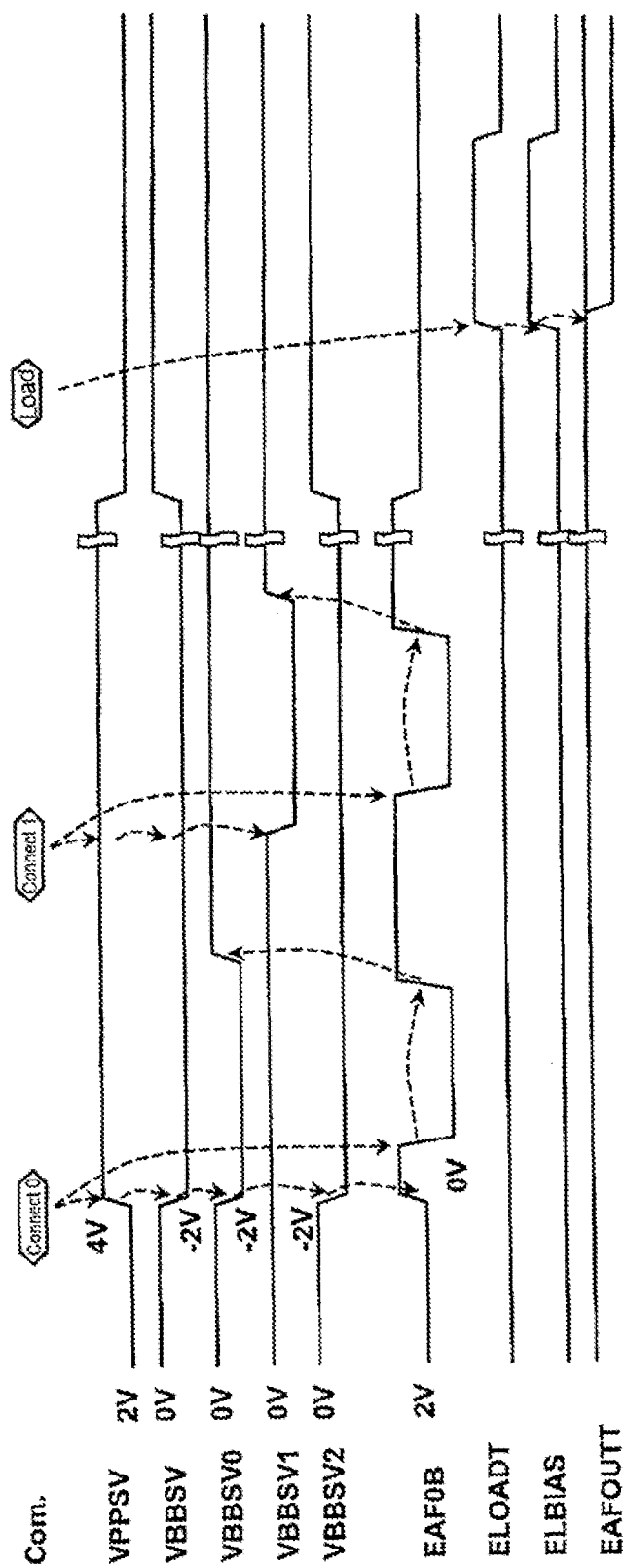
FIG. 5 is a waveform view showing an example of operation waveforms of the AF relief circuit illustrated in FIG. 4.

Referring now to FIG. 5, description will be made as regards operation of the AF relief circuit 10A according to the first exemplary embodiment.

FIG. 5 shows operation waveforms of the AF relief circuit 10A illustrated in FIG. 4.

(1) First, the Description Will Proceed to an Initial State.

In the initial state, the AF connection voltage High level VPPSV is set to 2 volts, the connection condition AF cell selection signal EAF0B is also set to 2 volts, the first, the third, and the fifth MOS switches S0, S2, and S4 in the control circuit 22A are turned on, and the second, the fourth, and the sixth MOS switches S1, S3, and S5 therein are turned off.

Therefore, the second through the fourth nodes 12 to 14 are applied with 0 volts equal to the ground voltage as the first through the third potentials VBBSV0, VBBSV1, and VBBSV2. Inasmuch as the loading condition AF cell selection signal ELOADT is equal to a Low level and the loading condition bias voltage ELBIAS is equal to a Low level, the loading condition AF cell output signal EAFOUTT becomes a High level.

(2) Second, the Description Will Proceed to a Connection Operation after the Initial State.

In the connection operation, it will be assumed that first, a first connection operation (<connect 0> in FIG. 5) is carried out for the first anti-fuse AF0, and subsequently, a second connection operation (<connect 1> in FIG. 5) is carried out for the second anti-fuse AF1.

In the first connection operation (<connect 0>), the AF connection voltage High level VPPSV is risen to 4 volts, the connection condition AF cell selection signal EAF0B is also risen to 4 volts, the control circuit 22A turns the first and the fifth MOS switches S0 and S4 off and turns the second and the sixth MOS switches S1 and S5 on. Hence, the second and the fourth nodes 12 and 14 are applied with the AF connection voltage Low level VBBSV of −2 volts as the first and the third potentials VBBSV0 and VBBSV2. In this connection, the third node 13 is applied with 0 volts as the second potential VBBSV1 as it is.

In the manner as described above, the first connection operation is first carried out by applying the high voltage of 6 volts to both ends of the first anti-fuse AF0. In this event, the second anti-fuse AF1 is applied with a voltage of 4 volts.

Herein, the AF connection voltage Low level VBBSV of −2 volts is also called a second voltage while the ground voltage VSS of 0 volts is also called a third voltage. Accordingly, the second voltage VBBSV is lower than the first voltage VPPSV. The third voltage VSS is lower than the first voltage VPPSV and is higher than the second voltage VBBSV.

Therefore, in the first exemplar embodiment, the control circuit 22A is configured, for a first time period over which the selection circuit (20) is conducted, to apply to the second node (12) the second voltage (VBBSV) which is lower than the first voltage (VPPSV) and to apply to the third node (13) the third voltage (VSS) which is lower than the first voltage (VPPSV) and which is higher than the second voltage (VBBSV).

After the above-mentioned first connection operation comes to an end, the connection condition AF cell selection signal EAF0B is temporarily set to 0 volts.

In the second connection operation (<connect 1>), the AF connection voltage High level VPPSV is risen to 4 volts, the connection condition AF cell selection signal EAF0B is also risen to 4 volts, the control circuit 22A turns the first MOS switch S0 on and turns the second MOS switch S1 off. Hence, the second nodes 12 is applied with the ground voltage VSS of 0 volts as the first potential VBBSV0. Thereafter, the control circuit 22A turns the third MOS switch S2 off and turns the fourth MOS switch S3 on. Hence, the third node 13 is applied with the AF connection voltage Low level VBBSV of −2 volts as the second potential VBBSV1. In this connection, the second node 12 is applied with 0 volts as the first potential VBBSV0 as it is.

In the manner as described above, the second connection operation is carried out by applying the high voltage of 6 volts to both ends of the second anti-fuse AF1. In this event, the first anti-fuse AF0 is applied with a voltage of 4 volts.

Therefore, in the first exemplar embodiment, the control circuit 22A is configured, for a second time period over which the selection circuit (20) is conducted and which is different from the first time period, to apply the third voltage (VSS) to the second node (12) and to apply the second voltage (VBBSV) to the third node (13).

(3) Third, the description will proceed to a loading operation after the connection operation. The loading operation is similar to the loading operation in the above-mentioned related AF relief circuit 10.

Specifically, it will be assumed that the loading operation is carried out in the above-mentioned initial state. Under the circumstances, both of the loading condition AF cell selection signal ELAODT and the loading condition bias voltage ELBIAS change from the Low level to a High level. In this event, if either the first anti-fuse AF0 or the second anti-fuse AF1 is destroyed and connected, the loading condition AF cell output signal EAFOUTT changes from the High level to a Low level. On the other hand, if both of the first and the second anti-fuses AF0 and AF1 are not destroyed and not connected, the loading condition AF cell output signal EAFOUTT stays the High level.

Figure 6:
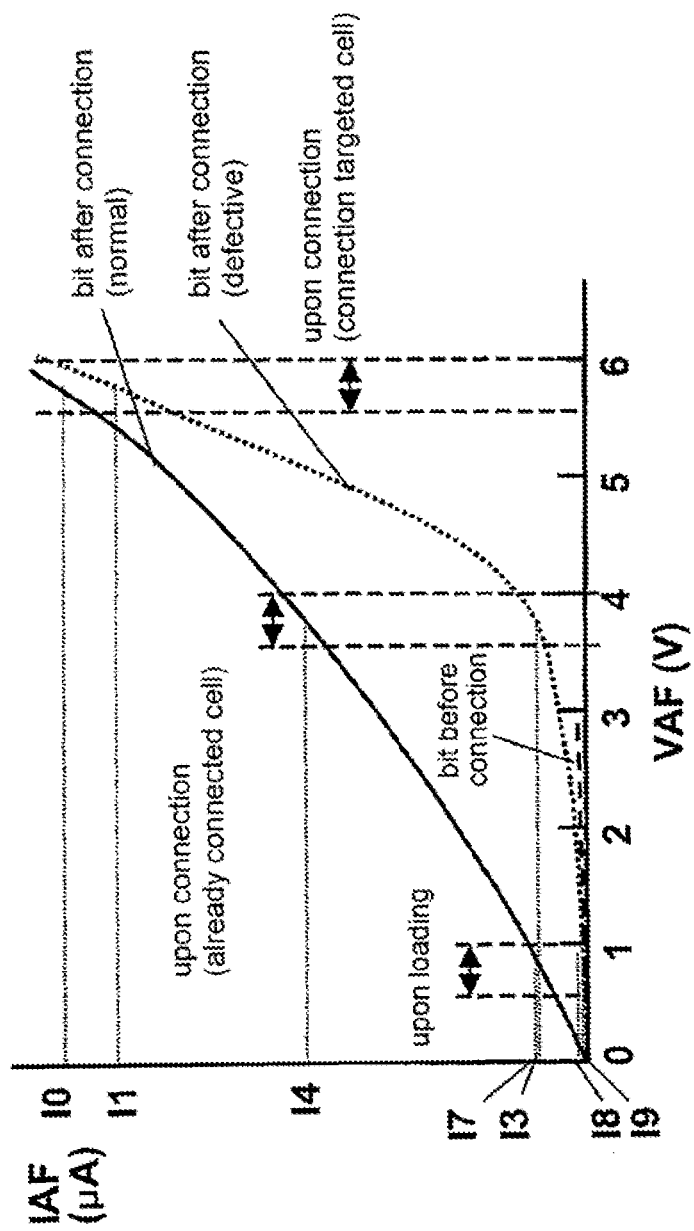
FIG. 6 is a view showing an I-V plot of an anti-fuse of the AF relief circuit illustrated in FIG. 4.

FIG. 6 is a view showing an I-V plot of an anti-fuse of the AF relief circuit 10A according to the first exemplary embodiment illustrated in FIG. 4.

Likewise FIG. 3, FIG. 6 is also a view showing a typical I-V plot of three bits. In FIG. 6, the abscissa represents a current IAF (µA) flowing in the anti-fuse, the ordinate represents a voltage VAF (V) applied to the anti-fuse. In FIG. 6, a broken line represents an I-V plot of a bit before the connection of the anti-fuse, a solid line represents an I-V plot of a bit (a normal bit) after the connection of the anti-fuse, and a dotted line represents an I-V plot of a bit (a defective bit) after the connection of the anti-fuse.

There is apprehension, in the AF relief circuit 10A according to the first exemplary embodiment as well, that the second connection operation cannot be carried out for the second anti-fuse AF1 by flowing the large current in the first anti-fuse AF0 side upon the second connection operation of the second anti-fuse AF1 in a case where the first anti-fuse AF0 is already connected in the manner of the related AF relief circuit 10 because the selection circuit 20 is common in the two anti-fuses AF0 and AF1.

Resultantly, the AF relief circuit 10A according to the first exemplary embodiment connects an anti-fuse with reliability that is paired with the anti-fuse having the nonlinear I-V plot of the defective bit after connection depicted at the dotted line, in the manner which will later be described.

As shown in FIG. 6, the defective bit depicted at the dotted line shows the nonlinear I-V plot. Accordingly, although a large current I1 flows by application of the high voltage of 6 volts, a current drastically reduces up to I3 by decreasing the voltage to 4 volts. Therefore, in the first exemplary embodiment, a current flows in another anti-fuse to enable to connect.

More specifically, with circuit configuration according to the first exemplary embodiment illustrated in FIG. 4, in a case where one AF cell (e.g. AF0) is put into the defective AF cell after connection and another AF cell (e.g. AF1) is connected, it is configured that the first node 11 shown in FIG. 4 has a potential which is higher than that of the first node 11 of the prior art shown in FIG. 1.

The description may be made by using FIG. 6 as follows. It will be assumed that the first P-channel MOSFET P0 has a resistance R1 of negligible small value. It may be considered that the defective AF cell AF0 after connection has a potential deference of 6 volts in a case of configuration of FIG. 1 while the defective AF cell AF0 after connection has a potential difference of 4 volts in a case of configuration of FIG. 4. In the I-V plot shown in experience result of FIG. 6, the large current flows in the defective AF cell after connection as shown in I4 in a bias of about 6 volts while the large current does not flows in the detective AF cell after connection as shown in I3 at a bias of about 4 volts (I4>>I3). In other words, the large current flows in the defective AF cell in the configuration of FIG. 1 while the large current does not flows in the detective AF cell in the configuration of FIG. 4. Therefore, the configuration of FIG. 4 is not susceptible to current release due to the defective AF cell AF0, and it is therefore for the configuration of FIG. 4 possible to bias the potential of the first node 11 at a high potential as compared with the configuration of FIG. 1.

In addition, this can be described as follows, for example, without using FIG. 6. It will be considered that the current flows through the defective AF cell AF0 in the second connection operation for a second AF cell.

In a case of the configuration of FIG. 1, a potential (V1) of the first node 11 is determined by a value obtained by dividing the AF connection voltage High level VPPSV of 4 volts and the first potential VBBSV0 of the second node 12 of −2 volts by the resistance R1 of the P-channel MOSFET P0 and a resistance R2 of the first anti-fuse AF0, namely, $$V1=(R1R2/(R1+R1))\times(4/R1-2/R2)$$

On the other hand, in a case of the configuration of FIG. 4, a potential (V2 of the first node 11 is determined by a value obtained by dividing the AF connection voltage High level VPPSV of 4 volts and the first potential VBBSV0 of the second node 12 of 0 volts by the resistance R1 of the P-channel MOSFET P0 and the resistance R2 of the first anti-fuse AF0, namely, $$V2=(R1R2/(R1+R1))\times(4/R1)$$

As a consequence of this, the potential (V2) of the first node 11 shown in FIG. 4 is higher than the potential (V1) of the first node 11 shown in FIG. 1, namely, V1<V2.

Thus, in the circuit configuration according to the first exemplary embodiment shown in FIG. 4, it is possible to make a potential difference of both ends of another anti-fuse (e.g. AF1) higher in a state where one anti-fuse (e.g. AF0) is put into the defective AF cell after connection.

Accordingly, in the circuit configuration according to the first exemplary embodiment shown in FIG. 4, it is possible to carry out the connection operation of the anti-fuse (e.g. AF1) of the second cell although the anti-fuse (e.g. AF0) of the first cell is put into the defective AF anti-fuse after connection.

With reference to this, in a case of the normal bit after connection depicted at the solid line, because the linear characteristic, the large current I4 flows continuously while the voltage is decreased to 4 volts, and then the voltage is not applied to an anti-fuse paired therewith. However, in this case, inasmuch as one anti-fuse is already normally connected, no connection of the other anti-fuse is no problem.

Now, description will be made as regards an area of the AF relief circuit 10A according to the first exemplary embodiment in contradistinction to other schemes.

Although it is necessary for the AF relief circuit 10A according to the first exemplary embodiment to separate the low potential applied line 10d for applying the AF connection voltage Low level VBBSV in comparison with the related AF relief circuit 10 (the convention twin cell scheme) illustrated in FIG. 1, it is possible to reduce by about forty-nine percent against the above-mentioned OR cell scheme (the Conventional Example 3) without increasing the area. It is therefore possible to realize the AF relief circuit 10A according to the first exemplary embodiment at the area which is substantially equivalent to fifty-three percent in the above-mentioned OR withdrawn scheme (the Conventional Example 2).

Figure 7:
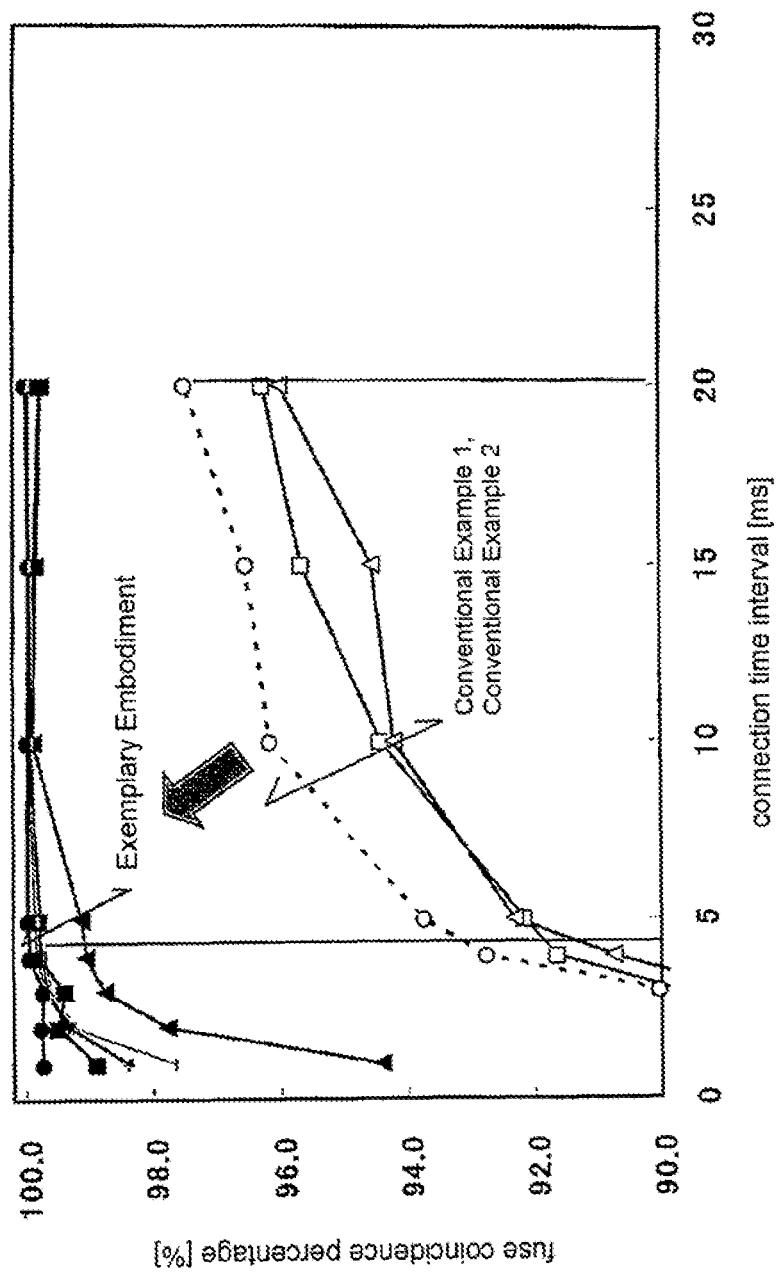
FIG. 7 is a view showing a relationship between a fuse coincidence percentage and a connection time interval of the AF relief circuit illustrated in FIG. 4, together with those of Conventional Example 1 and Conventional Example 2.

FIG. 7 shows a relationship between a fuse coincidence percentage and a connection time interval of the AF relief circuit 10A according to the first exemplary embodiment.

In FIG. 7, the abscissa represents the connection time interval [ms] and the ordinate represents the fuse coincidence percentage [%].

The connection operations twice are required in the AF relief circuit 10A according to the first exemplary embodiment because the twin cell scheme. Nevertheless, the AF relief circuit 10A according to the first exemplary embodiment reduces the connection time interval by about half in contradistinction to the Conventional Example 1 and the Conventional Example 2 and can realize the fuse coincidence percentage of 100%.

[Second Exemplary Embodiment]

An AF relief circuit according to a second exemplary embodiment of the present invention is similar in circuit configuration to the AF relief circuit 10A illustrated in FIG. 4 but is different in connection operation therefrom in the manner which will later become clear.

Figure 8:
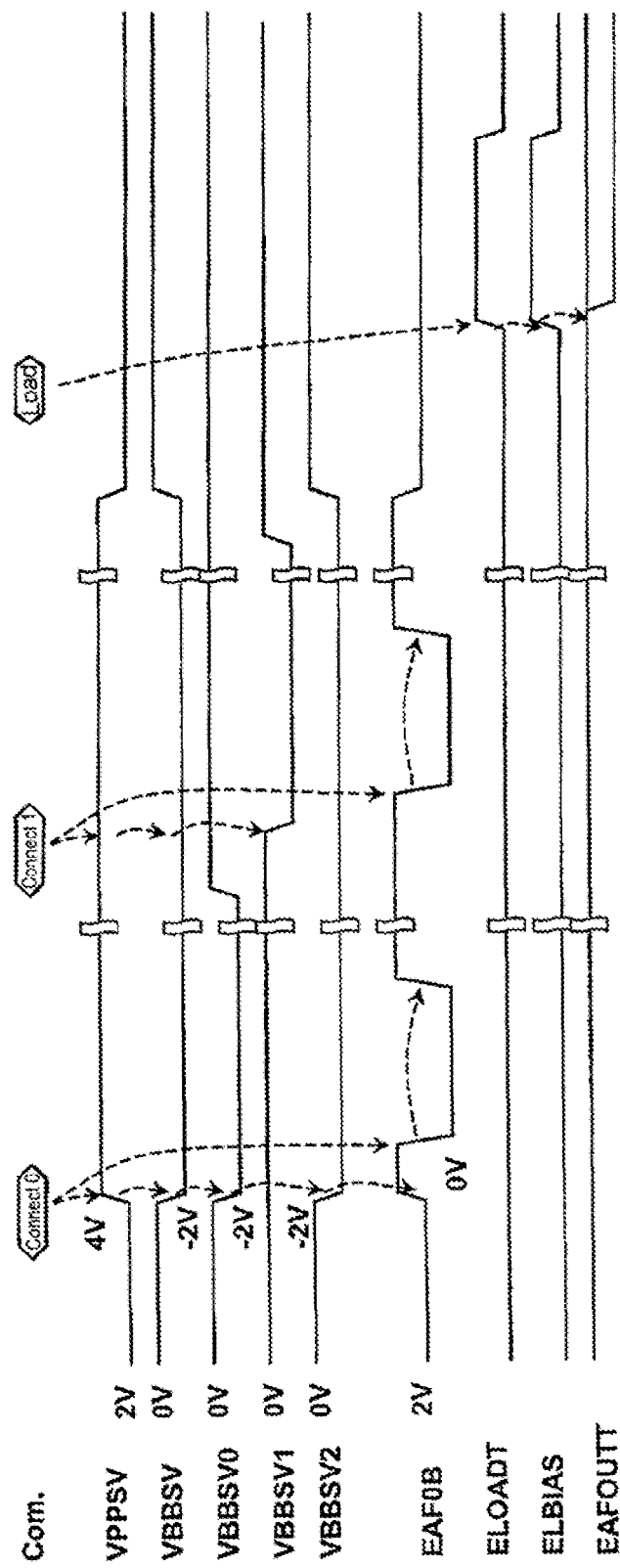
FIG. 8 is a waveform view showing an example of operation waveforms of the AF relief circuit according to a second exemplary embodiment of the present invention.

FIG. 8 is a waveform view showing an example of operation waveforms of the AF relief circuit 10A according to the second exemplary embodiment.

Now, description will be made as regards differences in comparison with the operation waveforms of the AF relief circuit 10A according to the first exemplary embodiment illustrated in FIG. 5.

As illustrated in FIG. 5, the AF relief circuit 10A according to the first exemplary embodiment carries out the connection operation in order of the first anti-fuse AF0, the second anti-fuse AF1, the next set, and so on. In this example, although it is possible to realize the twin cell scheme, it is necessary to switch the second node 12 and the third node 13 to 0 volts and −2 volts as the first and the second potentials VBBSV0 and VBBSV1 every time. As a result, a time interval until the voltage is stabilized becomes redundant in comparison with the Conventional Examples.

In contrast with this, as illustrated in FIG. 8, the AF relief circuit 10A according to the second exemplary embodiment connects first all set of the first anti-fuse AF0 side and then connects all set of the second anti-fuse AF1 side. This method can further reduce the connection time interval in comparison with the first exemplary embodiment because it is unnecessary to switch the second node 12 and the third node 13 to 0 volts and −2 volts as the first and the second potentials VBBSV0 and VBBSV1 every time.

[Third Exemplary Embodiment]

Figure 9:
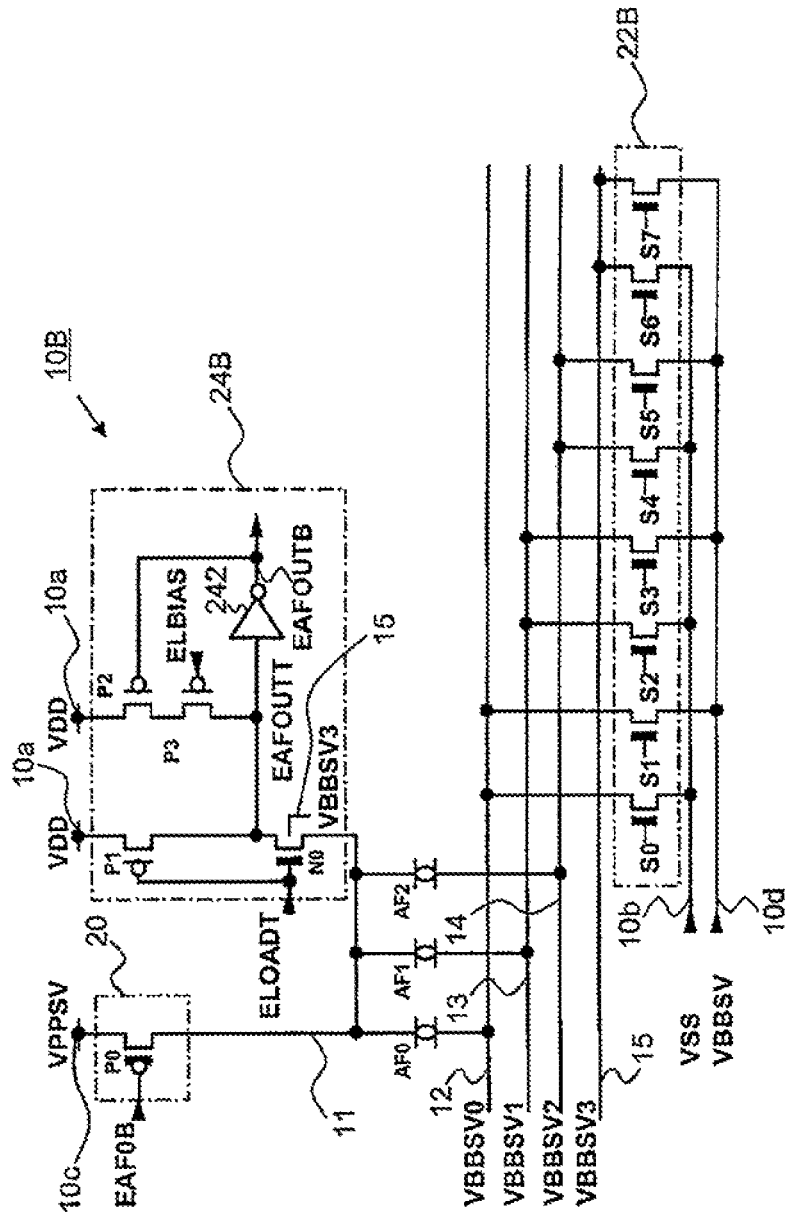
FIG. 9 is a circuit diagram showing a configuration of an AF relief circuit according to a third exemplary embodiment of the present invention, for use in a semiconductor memory device.

FIG. 9 is a circuit diagram showing a configuration of an AF relief circuit 10B according to a third exemplary embodiment of the present invention, for use in a semiconductor memory device.

The illustrated AF relief circuit 10B is similar in structure and operation to the AF relief circuit 10A according to the first exemplar embodiment illustrated in FIG. 4 except that a third anti-fuse AF2 and a fifth node 15 are added and configurations of the control circuit and the readout circuit are modified from those illustrated in FIG. 4 as will later become clear. The control circuit and the readout circuit are therefore depicted at reference signs of 22B and 24B, respectively. Those having functions similar to the AF relief circuit 10A according to the first exemplary embodiment illustrated in FIG. 4 are depicted at the same reference signs, the description thereof will be omitted for the sake of simplification of the description.

The illustrated AF relief circuit 10B has, as the nodes, first through fifth nodes 11, 12, 13, 14, and 15. As apparent from FIG. 9, the second through the fifth node 12 to 15 are supplied with first through fourth potentials VBBSV0, VBBSV1, VBBSV2, and VBBSV3, respectively.

The third anti-fuse AF2 is connected between the first node 11 and the fourth node 14. The second through the fourth nodes 12 to 14 are not connected to one another.

Accordingly, a semiconductor device according to the third exemplary embodiment comprises: the first power supply line (10c) supplying the first voltage (VPPSV); the first through the fourth nodes (11, 12, 13, 14); the selection circuit (20) connected between the first power supply line (10c) and the first node (11); the first anti-fuse (AF0) connected between the first node (11) and the second node (12); the second anti-fuse (AF1) connected between the first node (11) and the third node (13); and the third anti-fuse (AF2) connected between the first node (11) and the fourth node (14), and wherein the second through the fourth nodes (12, 13, 14) are not connected to one another.

The control circuit 22B is similar in structure and operation to the control circuit 22A illustrated in FIG. 4 except that the control circuit 22B further comprises seventh and eighth MOS switches S6 and S7.

The seventh MOS switch S6 is connected between the fifth node 15 and the ground applied terminal 10b. The eighth MOS switch S7 is connected to the fifth node 15 and the low potential applied line 10d.

The readout circuit 24B is similar in structure and operation to the readout circuit 24A illustrated in FIG. 4 except that the substrate of the first N-channel MOSFET N0 is connected to the fifth node 15 supplied with the fourth potential VBBSV3.

In the manner as described above, the AF relief circuit 10B according to the third exemplary embodiment is characterized in that the three anti-fuses AF0, AF1, and AF2 are connected in parallel and the AF connection voltage Low level VBSS is separated. And, in the AF relief circuit 10B according to the third exemplary embodiment, the selection circuit 20 and the readout circuit 24B are common to those of the AF relief circuit 10A. It is therefore, in the AF relief circuit 10B according to the third exemplary embodiment, possible to realize yield which is equivalent to that of the above-mentioned OR cell scheme (the Conventional Example 3) with increase of the area restrained at minimum.

In the AF relief circuit 10B according to the third exemplary embodiment, when the first through the third anti-fuses AF0 to AF2 are connected and upon loading, the control circuit 22B makes the first through the eighth MOS switches S0 to S7 on/off control as follows.

Upon connecting the first anti-fuse AF0, for a first time period over which the selection circuit 20 is conducted, the control circuit 22B turns the second, the third, the fifth, and the eighth MOS switches S1, S2, S4, and S7 on and turns the first, the fourth, the sixth, and the seventh MOS switches S0, S3, S5, and S6 off. Hence, the second node 12 is applied with the AF connection voltage Low level VBBSV of −2 volts as the first potential VBBSV0, the third node 13 is applied with the ground voltage VSS of 0 volts as the second potential VBBSV1, the fourth node 14 is applied with the ground voltage VSS of 0 volts as the third potential VBBSV2, and the fifth node 15 is applied with the AF connection voltage Low level VBBSV of −2 volts as the fourth potential VBBSV3.

Upon connecting the second anti-fuse AF1, for a second time period over which the selection circuit 20 is conducted and which is different from the first time period, the control circuit 22B turns the first, the fourth, the fifth, and the eighth MOS switches S0, S3, S4, and S7 on and turns the second, the third, the sixth, and the seventh MOS switches S1, S2, S5, and S6 off. Thus, the second node 12 is applied with the ground voltage VSS of 0 volts as the first potential VBBSV0, the third node 13 is applied with the AF connection voltage Low level VBBSV of −2 volts as the second potential VBBSV1, the fourth node 14 is applied with the ground voltage VSS of 0 volts as the third potential VBBSV2, and the fifth node 15 is applied with the AF connection voltage Low level VBBSV of −2 volts as the fourth potential VBBSV3.

Upon connecting the third anti-fuse AF2, for a third time period over which the selection circuit 20 is conducted and which is different from the first and the second time periods, the control circuit 22B turns the first, the third, the sixth, and the eighth MOS switches S0, S2, S5, and S7 on and turns the second, the fourth, the fifth, and the seventh MOS switches S1, S3, S4, and S6 off. Hereby, the second node 12 is applied with the ground voltage VSS of 0 volts as the first potential VBBSV0, the third node 13 is applied with the ground voltage VSS of 0 volts as the second potential VBBSV1, the fourth node 14 is applied with the AF connection voltage Low level VBBSV of −2 volts as the third potential VBBSV2, and the fifth node 15 is applied with the AF connection voltage Low level VBBSV of −2 volts as the fourth potential VBBSV3.

On the other hand, upon loading, the control circuit 22B turns the first, the third, the fifth, and the seventh MOS switches S0, S2, S4, and S6 on and turns the second, the fourth, the sixth, and the eighth MOS switches S1, S3, S5, and S7 off. As a result of this, all of the second through the fifth nodes 12 to 15 are applied with the ground voltage VSS of 0 volts as the first through the fourth potentials VBBSV0, VBBSV1, VBBSV2, and VBBSV3, respectively.

The AF relief circuit 10B according to the third exemplary embodiment also has the effect of improving yield with an area thereof reduced.

[Fourth Exemplary Embodiment]

Although the above-mentioned AF relief circuits according to the first through the third exemplary embodiments comprise two or three anti-fuses, the AF relief circuit may comprise four or more anti-fuses.

That is, although figure is omitted, an AF relief circuit according to a fourth exemplary embodiment of the present invention comprises first through N-th anti-fuses where N represents an integer which is not less than four. In this event, the AF relief circuit according to the fourth exemplary embodiment has first through (N+1)-th nodes.

Accordingly, a semiconductor device according to the fourth exemplary embodiment comprises: a first power supply line supplying a first voltage; first through (N+1)-th nodes; a selection circuit connected between the first power supply line and the first node; and first through N-th anti-fuses, an n-th node being connected between the first node and an (n+1)-th node where n represents a variable between one and N, both inclusive, and wherein the second through the (N+1) nodes are not connected to one another.

The AF relief circuit according to the fourth exemplary embodiment also has the effect of improving yield with an area thereof reduced.

While the invention has been particularly shown and described with reference to exemplary embodiments thereof, the invention is not limited to these embodiments. It will be understood by those of ordinary skill in the art that various changes in form and details may be made therein without departing from the sprit and scope of the present invention as defined the claims. For example, the selection circuit 20, the control circuits 22A, 22B, and the readout circuits 24A, 24B are not limited to configurations of the above-mentioned exemplary embodiments, as a matter of course, this invention may use various configurations as their circuits.

What is claimed is:

1. A device comprising:
a first power supply line supplying a first voltage;
first, second, and third nodes;
a selection circuit connected between the first power supply line and the first node;
a first anti-fuse connected between the first node and the second node;
a second anti-fuse connected between the first node and the third node, the second and third nodes being not connected to each other;
a first transistor coupled to the second node and to a second voltage;
a second transistor coupled to the second node and to a third voltage;
a third transistor coupled to the third node and to the second voltage; and
a fourth transistor coupled to the third node and to the third voltage.

2. A device comprising:
a first power supply line supplying a first voltage;
first, second, and third nodes;
a selection circuit connected between the first power supply line and the first node;
a first anti-fuse connected between the first node and the second node;
a second anti-fuse connected between the first node and the third node, the second and third nodes being not connected to each other; and
a control circuit configured to apply a second voltage to the second node and a third voltage to the third node during a first time period that the selection circuit is conducted, the third voltage being lower than the first voltage and higher than the second voltage.

3. The device as claimed in claim 2, wherein the control circuit is configured to apply the third voltage to the second node and the second voltage to the third node during a. second time period that the selection circuit is conducted and which is different from the first time period.

4. The device as claimed in claim 1, further comprising:
a readout circuit connected to the first node to read data from the first and second anti-fuses.

5. The device as claimed in claim 1, further comprising:
a fourth node; and
a third anti-fuse connected between the first node and the fourth node, and the second, third, and fourth nodes being not connected to one another.

6. A device comprising:
a first power supply line supplying a first voltage;
first, second, and third nodes;
a selection circuit connected between the first power supply line and the first node;
a first anti-fuse connected between the first node and the second node; and
a second anti-fuse connected between the first node and the third node, the second and third nodes being not connected to each other;
a fourth node;
a third anti-fuse connected between the first node and the fourth node, and the second, third, and fourth nodes being not connected to one another; and
a control circuit configured to apply a second voltage to the second node, a third voltage to the third node, and the third voltage to the fourth node during a first time period that the selection circuit is conducted, the third voltage being is lower than the first voltage and higher than the second voltage.

7. The device as claimed in claim 6, wherein the control circuit is configured to apply the third voltage to the second node, the second voltage to third node, and the third voltage to the fourth node during a second time period that the selection circuit is conducted and which is different from the first time period.

8. The device as claimed in claim 7, wherein the control circuit is configured to apply the third voltage to the second node, the third voltage to the third node, and the second voltage to the fourth node during a third time period that the selection circuit is conducted and which is different from the first and the second time periods.

9. The device as claimed in claim 5, further comprising:
a readout circuit connected to the first node to read data from the first, second, and third anti-fuses.

10. A device comprising:
first and second anti-fuses configured to store one bit information, and
one ends of the first and second anti-fuses being connected to each other to be biased in a same voltage as each other when one of the first and second anti-fuses is programmed, and other ends of the first and second anti-fuses being connected to a respective node to be biased in a different voltage from each other when the one of the first and second anti-fuses is programmed, the respective node of the first anti-fuse coupled to a first transistor and a second transistor and the respective node of the second anti-fuse coupled to a third transistor and a fourth transistor, the first and third transistors configured to couple the respective nodes to a first voltage, and the second and fourth transistors configured to couple the respective nodes to a second voltage.

11. The device as claimed in claim 10, wherein the one ends of the first and second anti-fuses are connected to each other to be biased in a same voltage as each other when the first and second anti-fuses are read out, and the other ends of the first and second first and second anti-fuses are biased in a same voltage as each other when the first and second anti-fuses are read out.

12. The device as claimed in claim 10, further comprising:
a selection transistor coupled in common to the one ends of the first and second anti-fuses and configured to be rendered conductive when the one of the first and second anti-fuses is programmed.

13. The device as claimed in claim 10, further comprising:
a read circuit coupled in common to the one ends of the first and second anti-fuses and configured to read data out from the first and second anti-fuses.

14. A method comprising:
performing a programming operation on first and second anti-fuses configured to store one bit information, the performing comprising:
performing a first connection by applying a first voltage in common to one ends of the first and second anti-fuses, applying a second voltage to other end of the first anti-fuse, and applying a third voltage to other end of the second anti-fuse concurrently, the third voltage being lower than the first voltage and higher than the second voltage;
performing a second connection by applying the first voltage in common to the one ends of the first and second anti-fuses, applying the third voltage to the other end of the first anti-fuse, and applying the second voltage to the other end of the second anti-fuse concurrently;

after the performing of the program operation, performing a read operation on the first and second anti-fuses, the performing of the read operation comprising:

turning off a load transistor coupled between a sensing node and a common node that is connected in common to the one ends of the first and second anti-fuse;

charging the sensing node during turning off the load transistor;

turning on the load transistor; and sensing a value of the sensing node during the turning on the load transistor.

\* \* \* \* \*